United States Patent
Padmanaban et al.

(10) Patent No.: US 8,632,948 B2
(45) Date of Patent: Jan. 21, 2014

(54) POSITIVE-WORKING PHOTOIMAGEABLE BOTTOM ANTIREFLECTIVE COATING

(75) Inventors: Munirathna Padmanaban, Bridgewater, NJ (US); Srinivasan Chakrapani, Bridgewater, NJ (US); Francis M. Houlihan, Millington, NJ (US); Shinji Miyazaki, Fukuroi (JP); Edward Ng, Belle Mead, NJ (US); Mark O. Neisser, Whitehouse Station, NJ (US)

(73) Assignee: AZ Electronic Materials USA Corp., Somerville, NY (US)

( * ) Notice: Subject to any disclaimer, the term of this patent is extended or adjusted under 35 U.S.C. 154(b) by 343 days.

(21) Appl. No.: 12/570,923

(22) Filed: Sep. 30, 2009

(65) Prior Publication Data

US 2011/0076626 A1 Mar. 31, 2011

(51) Int. Cl.
*G03F 7/039* (2006.01)
*G03F 7/30* (2006.01)
*C08F 20/20* (2006.01)

(52) U.S. Cl.
USPC .......... 430/273.1; 430/270.1; 430/271.1; 430/288.1; 430/326; 430/330; 430/285.1

(58) Field of Classification Search
None
See application file for complete search history.

(56) References Cited

U.S. PATENT DOCUMENTS

| | | | |
|---|---|---|---|
| 3,523,795 A | 8/1970 | Ohkubo et al. | |
| 4,061,465 A | 12/1977 | Franklin et al. | |
| 4,229,274 A | 10/1980 | Carlblom | |
| 4,388,450 A | 6/1983 | Crivello | |
| 4,491,628 A | 1/1985 | Ito et al. | |
| 4,845,265 A | 7/1989 | Lapin et al. | |
| 4,863,827 A | 9/1989 | Jain et al. | |
| 4,910,122 A | 3/1990 | Arnold et al. | |
| 5,069,997 A | 12/1991 | Schwalm et al. | |
| 5,114,826 A | 5/1992 | Kwong et al. | |
| 5,147,946 A | 9/1992 | Liu | |

(Continued)

FOREIGN PATENT DOCUMENTS

DE 39 30 086 A 1 3/1991
DE 39 30 087 A 1 3/1991

(Continued)

OTHER PUBLICATIONS

Third Office Action dated Jul. 14, 2011 for Chinese Patent Application No. CN 200580011869.5, which corresponds to U.S. Appl. No. 10/808,884.

(Continued)

*Primary Examiner* — Cynthia Hamilton
(74) *Attorney, Agent, or Firm* — Sangya Jain

(57) ABSTRACT

The invention relates to a photoimageable antireflective coating composition capable of forming a pattern by development in an aqueous alkaline solution, comprising, (i) a polymer A soluble in a coating solvent and comprises a chromophore, a crosslinking moiety, and optionally a cleavable group which under acid or thermal conditions produces a functionality which aids in the solubility of the polymer in an aqueous alkaline solution and; (ii) at least one photoacid generator; (iii) a crosslinking agent; (iv) optionally, a thermal acid generator; (v) a polymer B which is soluble in an aqueous alkaline solution prior to development, where polymer B is nonmiscible with polymer A and soluble in the coating solvent, and; (vi) a coating solvent composition, and (vii) optionally, a quencher. The invention also relates to a process for imaging the antireflective coating.

9 Claims, 1 Drawing Sheet

(56) References Cited

U.S. PATENT DOCUMENTS

| | | | |
|---|---|---|---|
| 5,242,715 A | 9/1993 | Schoen et al. |
| 5,286,867 A | 2/1994 | Lohaus et al. |
| 5,338,641 A | 8/1994 | Pawlowski et al. |
| 5,340,682 A | 8/1994 | Pawlowski et al. |
| 5,350,660 A | 9/1994 | Urano et al. |
| 5,354,643 A | 10/1994 | Cabrera et al. |
| 5,362,608 A | 11/1994 | Flaim et al. |
| 5,482,817 A | 1/1996 | Dichiara et al. |
| 5,585,219 A | 12/1996 | Kaimoto et al. |
| 5,635,333 A | 6/1997 | Petersen et al. |
| 5,648,194 A | 7/1997 | Pai et al. |
| 5,650,261 A | 7/1997 | Winkle |
| 5,652,297 A | 7/1997 | McCulloch et al. |
| 5,716,756 A | 2/1998 | Pawlowski et al. |
| 5,731,386 A | 3/1998 | Thackeray et al. |
| 5,837,420 A | 11/1998 | Aoai et al. |
| 5,843,624 A | 12/1998 | Houlihan et al. |
| 5,876,900 A | 3/1999 | Watanabe et al. |
| 5,880,168 A | 3/1999 | Heinz et al. |
| 5,880,169 A | 3/1999 | Osawa et al. |
| 5,882,996 A | 3/1999 | Dai |
| 5,886,102 A | 3/1999 | Sinta et al. |
| 5,935,760 A | 8/1999 | Shao et al. |
| 5,939,234 A | 8/1999 | Yamanaka et al. |
| 5,939,235 A | 8/1999 | Kondo et al. |
| 5,939,236 A | 8/1999 | Pavelchek et al. |
| 5,972,560 A | 10/1999 | Kaneko et al. |
| 5,981,145 A | 11/1999 | Ding et al. |
| 5,997,993 A | 12/1999 | Bi et al. |
| 6,033,830 A | 3/2000 | Sinta et al. |
| 6,054,254 A | 4/2000 | Sato et al. |
| 6,080,530 A | 6/2000 | Shao et al. |
| 6,103,445 A | 8/2000 | Willson et al. |
| 6,110,653 A | 8/2000 | Holmes et al. |
| 6,111,143 A | 8/2000 | Park et al. |
| 6,114,085 A | 9/2000 | Padmanaban et al. |
| 6,124,077 A | 9/2000 | Imai et al. |
| 6,132,926 A | 10/2000 | Jung et al. |
| 6,187,506 B1 | 2/2001 | Ding et al. |
| 6,200,728 B1 | 3/2001 | Cameron et al. |
| 6,207,342 B1 | 3/2001 | Takechi et al. |
| 6,251,562 B1 | 6/2001 | Breyta et al. |
| 6,319,651 B1 | 11/2001 | Holmes et al. |
| 6,338,934 B1 | 1/2002 | Chen et al. |
| 6,358,665 B1 | 3/2002 | Pawlowski et al. |
| 6,447,980 B1 | 9/2002 | Rahman et al. |
| 6,455,230 B1 | 9/2002 | Damme et al. |
| 6,723,488 B2 | 4/2004 | Kudo et al. |
| 6,803,172 B2 | 10/2004 | Jung et al. |
| 6,831,285 B2 | 12/2004 | Hol et al. |
| 6,844,131 B2 | 1/2005 | Oberlander et al. |
| 6,846,612 B2 | 1/2005 | Deshpande |
| 6,866,984 B2 | 3/2005 | Jung et al. |
| 7,070,914 B2 | 7/2006 | Neisser et al. |
| 7,223,518 B2 | 5/2007 | Henderson et al. |
| 7,265,431 B2 | 9/2007 | Sivakumar |
| 7,358,408 B2 | 4/2008 | Rahman et al. |
| 7,395,450 B2 | 7/2008 | Karaki |
| 7,514,202 B2 | 4/2009 | Ohsawa et al. |
| 7,521,170 B2 | 4/2009 | Rahman et al. |
| 7,521,483 B2 | 4/2009 | Davey et al. |
| 7,541,134 B2 | 6/2009 | Iwabuchi et al. |
| 7,678,528 B2 | 3/2010 | Rahman et al. |
| 7,816,071 B2 | 10/2010 | Abdallah et al. |
| 7,824,837 B2 | 11/2010 | Wu et al. |
| 8,039,202 B2 | 10/2011 | Sui et al. |
| 8,088,548 B2 | 1/2012 | Houlihan et al. |
| 8,455,176 B2 | 6/2013 | Houlihan et al. |
| 2002/0012880 A1 | 1/2002 | Imai et al. |
| 2002/0045130 A1 | 4/2002 | Nitta et al. |
| 2002/0094382 A1 | 7/2002 | Imai et al. |
| 2003/0162120 A1 | 8/2003 | Yoon et al. |
| 2003/0215736 A1 | 11/2003 | Oberlander et al. |
| 2004/0018451 A1 | 1/2004 | Choi |
| 2004/0152009 A1 | 8/2004 | Yamaguchi et al. |
| 2005/0053850 A1 | 3/2005 | Askebjer et al. |
| 2005/0064326 A1 | 3/2005 | Yasunami et al. |
| 2005/0095532 A1 | 5/2005 | Kodama et al. |
| 2005/0106501 A1* | 5/2005 | Van Aert et al. ........... 430/270.1 |
| 2005/0214674 A1 | 9/2005 | Sui et al. |
| 2005/0255410 A1 | 11/2005 | Guerrero et al. |
| 2005/0271974 A1 | 12/2005 | Rahman et al. |
| 2005/0277058 A1 | 12/2005 | Iwabuchi et al. |
| 2005/0287816 A1 | 12/2005 | Blalock et al. |
| 2006/0177774 A1 | 8/2006 | Abdallah et al. |
| 2006/0183348 A1* | 8/2006 | Meagley et al. ............. 438/789 |
| 2007/0031760 A1 | 2/2007 | Chang et al. |
| 2007/0184648 A1 | 8/2007 | Yoon et al. |
| 2007/0219368 A1 | 9/2007 | Iwabuchi et al. |
| 2008/0008955 A1 | 1/2008 | Brodsky et al. |
| 2008/0038666 A1 | 2/2008 | Wu et al. |
| 2008/0090184 A1 | 4/2008 | Sui et al. |
| 2008/0138744 A1 | 6/2008 | Hatanaka et al. |
| 2008/0166667 A1* | 7/2008 | Goldfarb ...................... 430/322 |
| 2009/0042133 A1 | 2/2009 | Xiang et al. |
| 2009/0087799 A1 | 4/2009 | Tachibana et al. |
| 2009/0098490 A1 | 4/2009 | Pham et al. |
| 2009/0104559 A1 | 4/2009 | Houlihan et al. |
| 2010/0119972 A1 | 5/2010 | Houlihan et al. |
| 2011/0086312 A1 | 4/2011 | Dammel et al. |
| 2013/0236833 A1 | 9/2013 | Houlihan et al. |

FOREIGN PATENT DOCUMENTS

| | | |
|---|---|---|
| EP | 0 794 458 A2 | 9/1997 |
| JP | 56-47440 A | 4/1981 |
| JP | 6-295064 A | 10/1994 |
| JP | 2001-22057 A | 1/2001 |
| JP | 2004-31569 A | 1/2004 |
| JP | 2005-70154 A | 3/2005 |
| JP | 2009-92691 A | 4/2009 |
| JP | 2009-107996 A | 5/2009 |
| WO | WO 97/33198 A1 | 9/1997 |

OTHER PUBLICATIONS

English Translation of Third Office Action dated Jul. 14, 2011 for Chinese Patent Application No. CN 200580011869.5, which corresponds to U.S. Appl. No. 10/808,884.

Office Action mail date Mar. 20, 2012 for U.S. Appl. No. 12/576,622.

Eng. Trans. of Official Action mailed Sep. 13, 2011 from the JPO for Japanese Patent Application No. 2007-504508, which corresponds to U.S. Appl. No. 10/808,884.

Official Action received Aug. 17, 2011 from the KIPO for Korean Patent Application No. 10-2006-7022194, which corresponds to U.S. Appl. No. 10/808,884.

Eng. Trans. of Official Action received Aug. 17, 2011 from the KIPO for Korean Patent Application No. 10-2006-7022194, which corresponds to U.S. Appl. No. 10/808,884.

Office Action with Search Report from the Taiwan IPO received Sep. 13, 2011 for Taiwan Patent Application No. 094106806, which corresponds to U.S. Appl. No. 10/808,884.

Eng. Trans. of Office Action with Search Report from the Taiwan IPO received Sep. 13, 2011 for Taiwan Patent Application No. 094106806, which corresponds to U.S. Appl. No. 10/808,884.

Comm. pursuant to Article 94(3) EPC dated Feb. 17, 2011 from European Patent Office for European Patent Application No. 08 843 074.9, which corresponds to US.

Office Action mail date Feb. 1, 2011 for U.S. Appl. No. 11/877,891.

Office Action dated Apr. 26, 2011 for U.S. Appl. No. 12/269,072.

Notification of the Third Office Action dated Jan. 31, 2012 for Chinese Patent Application No. CN 200580011869.5, which corresponds to U.S. Appl. No. 10/808,884.

Eng. Lang. Transl. of Notification of the Third Office Action dated Jan. 31, 2012 for Chinese Patent Application No. CN 200580011869.5, which corresponds to U.S. Appl. No. 10/808,884.

Office Action mail date Jan. 23, 2012 for U.S. Appl. No. 12/576,622.

Form PCT/IB/326, Form PCT/IB/373, and Form PCT/ISA/237 for PCT/IB/2009/007451 dated May 26, 2011, which corresponds to U.S. Appl. No. 12/269,072.

(56) References Cited

OTHER PUBLICATIONS

Notice of Allowance and Fee(s) Due dated Jun. 15, 2011 from U.S. Appl. No. 11/877,891, which is a divisional of U.S. Appl. No. 10/808,884.
Notice of Allowance and Fee(s) Due date mailed May 12, 2011 from U.S. Appl. No. 11/876,793.
"Anion volumes database" obtained from http://www.warwick.ac.uk/fac/sci/Chemistry/thermochemistry/anion_volum_database.htm on May 8, 2011 citing H.D.B.Jenks article with 1999 date as source of information, 14 pages.
English Translation of Office Action dated Jul. 6, 2010 for Chinese Patent Application No. CN 200580011869.5 which corresponds to U.S. Appl. No. 10/808,884.
Advisory Action Before the Filing of an Appeal Brief dated Jul. 6, 2011 for U.S. Appl. No. 12/269,072.
English Translation of Office Action dated Jul. 24, 2009 for Chinese Patent Application No. CN 200580011869.5, which corresponds to U.S. Appl. No. 10/808,884.
Office Action dated Sep. 7, 2010 for U.S. Appl. No. 11/876,793.
Office Action dated Sep. 22, 2010 from European Patent Office for European Application No. 08 843 074.9, which corresponds to U.S. Appl. No. 11/876,793.
Office Action dated Sep. 1, 2010 for U.S. Appl. No. 12/269,072.
Jerry March, "Advanced Organic Chemistry: Reactions, Mechanisms, and Structure", Second Edition, McGraw-Hill Book Company, New York, NY, pp. 225-pp. 245 (1977).
Notice of Allowance and Fee(s) Due date mailed Sep. 7, 2011 for U.S. Appl. No. 11/876,793.
English Language Abstract from JPO of JP 56-47440 A.
Database WPI Week 198125 Thomson Scientific, London, GB; AN 1981-44838D XP002546976 & JP 56 047440 A (Japan Synthetic Rubber CO LTD) Apr. 30, 1981 & JP 56 047440 A (Japan Synthetic Rubber CO LTD) Apr. 30, 1981.
English Language Abstract from Derwent of JP 2001-22057 A.
Form PCT/ISA/220, Form PCT/ISA/210, and Form PCT/ISA/237 for PCT/IB2005/000773 dated Jul. 27, 2005, which corresponds to U.S. Appl. No. 10/808,884.
Form PCT/IB/326, Form PCT/IB/373, and Form PCT/ISA/237 for PCT/IB2005/000773 dated Oct. 5, 2006, which corresponds to U.S. Appl. No. 10/808,884.
Office Action dated Jun. 24, 2008 from U.S. Appl. No. 11/876,332, which is a divisional of prior U.S. Appl. No. 10/808,884.
Office Action dated Jan. 27, 2009 from U.S. Appl. No. 11/876,332, which is a divisional of U.S. Appl. No. 10/808,884.
Office Action dated Mar. 13, 2009 from U.S. Appl. No. 11/876,332, which is a divisional of U.S. Appl. No. 10/808,884.
Office Action Oct. 30, 2009 from U.S. Appl. No. 11/876,332, which is a divisional of U.S. Appl. No. 10/808,884.
Notice of Allowance and Fee(s) Due dated Mar. 8, 2010 from U.S. Appl. No. 11/876,332, which is a divisional of U.S. Appl. No. 10/808,884.
Notice of Allowance and Fee(s) Due dated Jun. 16, 2010 from U.S. Appl. No. 11/876,332, which is a divisional of U.S. Appl. No. 10/808,884.
Office Action dated Apr. 30, 2009 from U.S. Appl. No. 11/877,891, which is a divisional of U.S. Appl. No. 10/808,884.
Office Action dated Oct. 29, 2009 from U.S. Appl. No. 11/877,891 which is a divisional of U.S. Appl. No. 10/808,884.
Notice of Allowance and Fee(s) Due dated May 27, 2010 from U.S. Appl. No. 11/877,891, which is a divisional of U.S. Appl. No. 10/808,884.
Notice of Allowance and Fee(s) Due dated Jul. 8, 2010 from U.S. Appl. No. 11/877,891, which is a divisional of U.S. Appl. No. 10/808,884.
Office Action dated Sep. 18, 2009 from U.S. Appl. No. 11/876,793.
Office Action dated Feb. 4, 2010 from U.S. Appl. No. 11/876,793.
Form PCT/ISA/220, Form PCT/ISA/210, and Form PCT/ISA/237 for PCT/IB2005/0002847 dated Oct. 6, 2009, which corresponds to U.S. Appl. No. 11/876,793.
Office Action dated Jul. 6, 2010 from U.S. Appl. No. 12/269,072.
Invitation to Pay Additional Fees and, Where Applicable, Protest Fee (Form PCT/ISA/206) for PCT/IB2009/007451 dated Apr. 7, 2010, which corresponds to U.S. Appl. No. 12/269,072.
Form PCT/ISA/220, Form PCT/ISA/210, and Form PCT/ISA/237 for PCT/IB2009/0007451 dated Aug. 2, 2010, which corresponds to U.S. Appl. No. 12/269,072.
Form PCT/ISA/220, Form PCT/ISA/210, and Form PCT/ISA/237 for PCT/IB2009/007449 dated Feb. 10, 2010, which corresponds to U.S. Appl. No. 12/570,923.
Form PCT/ISA/220, Form PCT/ISA/210, and Form PCT/ISA/237 for PCT/IB2009/007456 dated Jan. 25, 2010, which corresponds to U.S. Appl. No. 12/576,622.
CRC Handbook of Chemistry & Physics, "Dissociation Constants of Organic Acids and Bases", CRC Press (1994-1995 75th Edition), pp. 8-45-pp. 8-55.
Ahn et al., "New Antireflective Coating Materials Containing a Novel Chromophore for KrF Laser Lithography", Journal of Photopolymer Science and Technology, vol. 14, No. 3, pp. 475-pp. 480 (2001).
Houlihan et al., "Chemically Amplified Resists: The Chemistry and Lithographic Characteristics of Nitrobenzyl Benzenesulfonate Derivatives", Journal of Photopolymer Science and Technology, vol. 3, No. 3, pp. 259-pp. 273 (1990).
Leonard V. Interrante, Chemistry of Materials, vol. 6, No. 10 (1994).
Lange's Handbook of Chemistry (15th Edition), Table 8.8 pKa Value of Organic Materials in Water at 25 degrees C Records 1426 and 1428, McGraw-Hill, www.knovel.com, 2 pages (1999).
Lee et al., "Performance of vinyl ether cross-linkers on resist for 193 nm lithography", SPIE, vol. 4690, pp. 541-548 (2002).
Moon et al., Three-Component Photopolymers Based on Thermal Cross-Linking and Acidolytic De-Cross-Linking of Vinyl Ether Groups. Effects of Binder Polymers on Photopolymer Characteristics, *Chemical Materials*, vol. 6, pp. 1854-pp. 1860 (1994).
Moon et al., "Three-component photoresists based on thermal crosslinking and acidolytic cleavage", Polymer 41, pp. 4013-pp. 4019 (2000).
Moon et al., "Two-component Photoresists Containing Thermally Crosslinkable Generators", Polymer Engineering and Science vol. 40, No. 5, pp. 1248-pp. 1255 (May 2000)—XP000969783.
Nakano et al., "Positive-Type Photopolyimide Based on Vinyl Ether Crosslinking and De-Crosslinking", Journal of Photopolymer Science and Technology vol. 13, No. 5, pp. 715-pp. 718 (2000).
Noppakundilograt et al., "Visible Light-Sensitive Positive-Working Photopolymer Based on Poly(p-hydroxystyrene) and Vinyl Ether Crosslinker", Journal of Photopolymer Science and Technology vol. 13, No. 5, pp. 719-pp. 722 (2000).
Papadopoulos et al., "Dissociation of Salicylic Acid, 2,4-, 2,5-, and 2,6- Dihydroxybenzoic Acids in 1-Propanol—Water Mixtures at 25° C.", Journal of Solution Chemistry, vol. 20, No. 3, pp. 293-pp. 300 (1991).
Schacht et al., "Acid Labile Cross-Linked Units: A Concept for Improved Positive Deep-UV Photoresists", American Chemical Society, pp. 78-pp. 94 (1998).
Schlegel et al., "Studies on the Acid Formation and Deprotection Reaction by Novel Sulfonates in a Chemical Amplification Positive Photoresist", Journal of Photopolymer & Science Technology, vol. 3, No. 3, pp. 281-pp. 287 (1990).
Shirai et al., "Photochemistry of Imino Sulfonate Compounds and Their Application to Chemically Amplified Resists", Journal of Photopolymer Science and Technology, vol. 3, No. 3, pp. 301-pp. 304 (1990).
White et al., "Synthesis and characterization of photodefinable polycarbonates for use as sacrificial materials in the fabrication of microfluidic devices", SPIE vol. 4690, pp. 242-pp. 253 (2002).
Willson Research Group, University of Texas at Austin, "Aqueous Processable Positive and Negative Tone Photoresists", Apr. 18, 2001, available at http://willson.cm.utexas.edu/Research/Sub_Files/Water_Soluble/index.php (last visited May 6, 2010), with cover page.
Yamada et al., "The design and study of aqueous-processable positibe tone photoresists", SPIE vol. 3999, pp. 569-pp. 578 (2000).
Yamada et al., "Positive and Negative Tone Water Processable Photoresists: A Progress Report", SPIE vol. 3333, pp. 245-pp. 253 (2000).

(56) References Cited

OTHER PUBLICATIONS

Yamaoka et al., "Photochemical Dissociation of p-Nitrobenzyl Aromatic Sulfonate and Its Application to Chemical Amplification Resists", *Journal of Photopolymer Science and Technology*, vol. 3, No. 3, pp. 275-pp. 280 (1990).
Yamaoka et al., "Reaction of vinyl ethers and application of photoreactive process", Trends in Photochemistry & Photobiology, vol. 7, pp. 45-pp. 70 (2001.
U.S. Appl. No. 12/576,622, filed Oct. 9, 2009, Dammel et al.
English Translation of Office Action mailed Oct. 12, 2010 for Japanese Patent Application No. 2007-504508, which corresponds to U.S. Appl. No. 10/808,884.
Complete set of specification papers for U.S. Appl. No. 12/576,622, filed Oct. 9, 2009 with cover page.
Jerry March, "0-11 Hydroysis of Esters" from Advanced Organic Chemistry: Reactions, Mechanisms, and Structure, Second Edition, McGraw-Hill Book Company, New York, NY, pp. 349-pp. 353 (1977).
Office Action dated Dec. 1, 2010 for U.S. Appl. No. 11/876,793.
Office Action dated Jun. 27, 2012 for U.S. Appl. No. 12/269,072.
Office Action dated Jun. 19, 2012 for Korean Patent Application No. 10-2011-7027434, which corresponds to U.S. Appl. No. 11/876,332.
Eng. Lang. Transl. of Office Action dated Jun. 19, 2012 for Korean Patent Application No. 10-2011-7027434, which corresponds to U.S. Appl. No. 11/876,332.
Form PCT/IB/326, Form PCT/IB/373, and Form PCT/ISA/237 dated Apr. 19, 2012 for PCT/IB/2009/007456, which corresponds to U.S. Appl. No. 12/576,622.
Office Action mail date Sep. 20, 2012 for U.S. Appl. No. 12/576,622.
English Language Abstract of JP 2009-107996 A from Derwent.
English Language Translation of JP 2009-107996 A from JPO.
Notice of Allowance mail date Feb. 5, 2013 for U.S. Appl. No. 12/269,072.
Notification of the First Office Action from the Chinese Patent Office for CN 200980161200.2 dated Dec. 4, 2012, which corresponds to U.S. Appl. No. 12/570,923.
English Language Translation of Notification of the First Office Action from the Chinese Patent Office for CN 200980161200.2 dated Dec. 4, 2012, which corresponds to U.S. Appl. No. 12/570,923.
Notification of the First Office Action from the Chinese Patent Office dated Dec. 4, 2012 for CN 200980161858.3, which corresponds to U.S. Appl. No. 12/576,622.
English Language Translation of Notification of the First Office Action from the Chinese Patent Office dated Dec. 4, 2012 for CN 200980161858.3, which corresponds to U.S. Appl. No. 12/576,622.
Notification of the First Office Action for CN 2009801447965 dated Apr. 11, 2013, which corresponds to U.S. Appl. No. 12/269,072.
English Language Translation of Notification of the First Office Action for CN 2009801447965 dated Apr. 11, 2013, which corresponds to U.S. Appl. No. 12/269,072.
Notification of the Second Office Action from the Chinese Patent Office for CN 200980161200.2 dated Aug. 8, 2013, which corresponds to U.S. Appl. No. 12/570,923.
Eng. Lang. Transl. of Notification of the Second Office Action from the Chinese Patent Office for CN 200980161200.2 dated Aug. 8, 2013, which corresponds to U.S. Appl. No. 12/570,923.
Notification of the Second Office Action from the Chinese Patent Office for CN 200980161858.3 dated Aug. 12, 2013, which corresponds to U.S. Appl. No. 12/576,622.
Eng. Lang. Transl. of Notification of the Second Office Action from the Chinese Patent Office for CN 200980161858.3 dated Aug. 12, 2013, which corresponds to U.S. Appl. No. 12/576,622.
Notification of the Second Office Action for CN 2009801447965 dated Sep. 30, 2013, which corresponds to U.S. Appl. No. 12/269,072.
English Language Translation of the Notification of the Second Office Action for CN 2009801447965 dated Sep. 30, 2013, which corresponds to U.S. Appl. No. 12/269,072.
English Language Translation of the Notification of the Official Action from the Japanese Patent Office for Japanese Patent Application No. 2012-531508 dated mailed Sep. 24, 2013, which corresponds to U.S. Appl. No. 12/570,923.
English Language Translation of the Notification of the Official Action from the Japanese Patent Office for Japanese Patent Application No. 2012-532672 dated mailed Oct. 29, 2013, which corresponds to U.S. Appl. No. 12/576,622.
Notification of the Second Office Action for CN 200880113002.4 dated Nov. 5, 2013, which corresponds to U.S. Appl. No. 11/876,793.
English Language Translation of the Notification of the Second Office Action for CN 200880113002.4 dated Nov. 5, 2013, which corresponds to U.S. Appl. No. 11/876,793.
English Language Translation of the Official Action for JP 2011-543837 mailed Oct. 29, 2013, which corresponds to U.S. Appl. No. 12/269,072.

\* cited by examiner

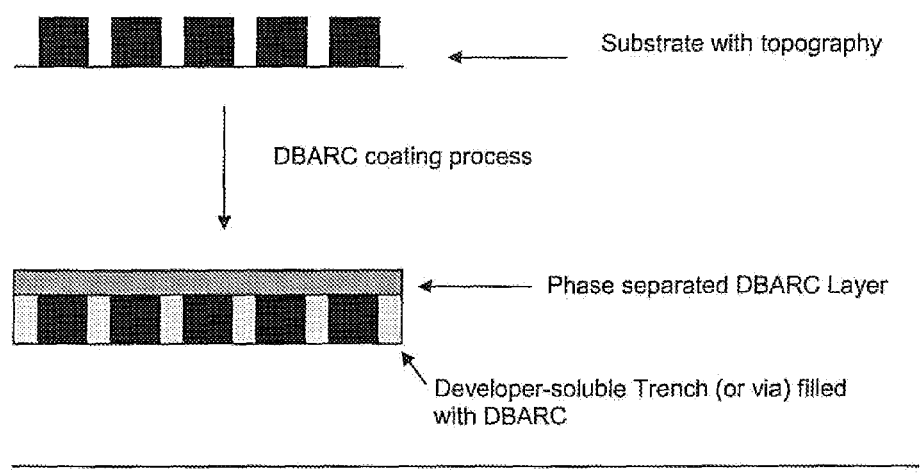

POSITIVE-WORKING PHOTOIMAGEABLE BOTTOM ANTIREFLECTIVE COATING

FIELD OF INVENTION

The present invention relates to novel positive-working, photoimageable, and aqueous developable antireflective coating compositions and their use in image processing by forming a layer of the novel developer soluble antireflective coating composition between a reflective substrate and a photoresist coating. Such compositions are particularly useful in the fabrication of semiconductor devices by photolithographic techniques, especially those requiring exposure with deep ultraviolet radiation.

DESCRIPTION

Photoresist compositions are used in microlithography processes for making miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked and coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

There are two types of photoresist compositions, negative-working and positive-working. When positive-working photoresist compositions are exposed image-wise to radiation, the areas of the photoresist composition exposed to the radiation become soluble in a developer solution while the unexposed areas of the photoresist coating remain relatively insoluble to such a solution. Thus, treatment of an exposed positive-working photoresist with a developer causes removal of the exposed areas of the photoresist coating and the formation of a positive image in the coating, thereby uncovering a desired portion of the underlying substrate surface on which the photoresist composition was deposited. In a negative-working photoresist the developer removes the portions that are not exposed.

The trend towards the miniaturization of semiconductor devices has led both to the use of new photoresists that are sensitive to lower and lower wavelengths of radiation, and also to the use of sophisticated multilevel systems to overcome difficulties associated with such miniaturization. The use of highly absorbing antireflective coatings in photolithography is a simpler approach to diminish the problems that result from back reflection of light from highly reflective substrates. The bottom antireflective coating is applied on the substrate and then a layer of photoresist is applied on top of the antireflective coating. The photoresist is exposed image-wise and developed. The antireflective coating in the exposed area is then typically etched and the photoresist pattern is thus transferred to the substrate. Most antireflective coatings known in the prior art are designed to be dry etched. The etch rate of the antireflective film needs to be relatively high in comparison to the photoresist so that the antireflective film is etched without excessive loss of the resist film during the etch process. There are two known types of antireflective coatings, inorganic coatings and organic coatings. However, both of these types of coatings have so far been designed for removal by dry etching.

In addition, photoresist patterns may be damaged or may not be transferred exactly to the substrate if the dry etch rate of the antireflective coating is similar to or less than the etch rate of the photoresist coated on top of the antireflective coating. The etching conditions for removing the organic coatings can also damage the substrate. Thus, there is a need for organic bottom antireflective coatings that do not need to be dry etched and can also provide good lithographic performance, especially for compound semiconductor type substrates, which are sensitive to etch damage.

The novel approach of the present application is to use an absorbing, positive image-forming bottom antireflective coating that can be developed by an aqueous alkaline solution, rather than be removed by dry etching. Aqueous removal of the bottom antireflective coating eliminates the dry etch rate requirement of the coating, reduces the cost intensive dry etching processing steps and also prevents damage to the substrate caused by dry etching. The absorbing bottom antireflective coating compositions of the present invention contain a crosslinking compound and at least two nonmiscible polymers, where in the coating the two polymers phase separate. The coating is cured and then upon exposure to light of the same wavelength as that used to expose the top positive photoresist the antireflective coating becomes imageable in the same developer as that used to develop the photoresist. This process greatly simplifies the lithographic process by eliminating a large number of processing steps. Since the antireflective coating is photosensitive, the extent of removal of the antireflective coating is defined by the latent optical image, which allows a good delineation of the remaining photoresist image in the antireflective coating.

SUMMARY OF THE INVENTION

The invention relates to a photoimageable antireflective coating composition capable of forming a pattern by development in an aqueous alkaline solution, comprising, (i) a polymer A soluble in a coating solvent and comprises a chromophore, a fluorinated group, a crosslinking moiety, and optionally a cleavable group which under acid or thermal conditions produces a functionality which aids in the solubility of the polymer in an aqueous alkaline solution and; (ii) at least one photoacid generator (iii) a crosslinking agent; (iv) optionally, a thermal acid generator, (v) a polymer B which is soluble in an aqueous alkaline solution prior to development, where polymer B is non-miscible with polymer A and soluble in the coating solvent, and; (vi) a coating solvent composition, and (vii) optionally, a quencher. The invention further relates to a process for imaging using the antireflective composition of the present invention.

The present invention also relates to a photoimageable antireflective coating composition capable of forming a pattern by development in an aqueous alkaline solution, comprising, (i) a polymer A soluble in a coating solvent and comprises a chromophore, a crosslinking moiety, and optionally a cleavable group which under acid or thermal conditions produces a functionality which aids in the solubility of the polymer in an aqueous alkaline solution and; (ii) at least one photoacid generator; (iii) a crosslinking agent; (iv) optionally, a thermal acid generator; (v) a polymer B which is soluble in an aqueous alkaline solution prior to development, where polymer B is non-miscible with polymer A and soluble in the coating solvent, and; (vi) a coating solvent composition; and (vii) optionally, a quencher.

BRIEF DESCRIPTION OF THE DRAWING

FIG. 1 shows the coating process for the developable antireflective coating.

DESCRIPTION OF THE INVENTION

The present invention relates to a novel absorbing, photoimageable and aqueous alkali developable positive imageforming antireflective coating composition comprising (i) a polymer A soluble in a coating solvent and comprises a chromophore, an optional fluorinated group, crosslinkable group such as a hydroxyl and/or a carboxyl moiety, and optionally a cleavable group which under acid or thermal conditions produces a functionality which aids in promoting the solubility of the polymer in an aqueous alkaline solution; (ii) at least one photoacid generator; (iii) a crosslinking agent; (iv) optionally, a thermal acid generator, (v) a polymer B which is soluble in an aqueous alkaline solution prior to development, where polymer B is non-miscible with polymer A and soluble in the coating solvent, and; (vi) a coating solvent composition; and (vii) optionally, a quencher.

The chromophore, optional fluorinated group and the crosslinkable moiety of polymer A may be in one monomeric unit or in separate units singly or in mixtures. The polymer A phase separates from the polymer B in the antireflective coating since both polymers are nonmiscible. The invention further relates to a process for using such a composition, especially for irradiation from about 50 nm to about 450 nm.

The antireflective coating composition of the invention is coated on a substrate and underneath a positive photoresist, in order to prevent reflections in the photoresist from the substrate. The novel antireflective coating is photoimageable with the same wavelength of light as the top photoresist, and is also developable with the same aqueous alkaline developing solution as that used to typically develop the photoresist, thus forming a pattern in the antireflective coating after the development step. The present novel aqueous alkali developable antireflective coating and the photoresist can be developed in the same step. The antireflective coating composition comprises at least two immiscible polymers, a crosslinking agent, a photoacid generator, optionally a thermal acid generator, and optionally a quencher. Upon forming the antireflective coating the two immiscible polymers A and B phase separate within the coating such that polymer B forms a layer beneath polymer A. When coated, polymer B may or may not be soluble in an aqueous alkaline solution, but is soluble in an aqueous alkaline solution prior to development; polymer B may or may not be crosslinked during the curing process; and, polymer B may or may not comprise a chromophore. Polymer A in the composition may or may not be soluble in the aqueous alkaline solution, but becomes soluble in an aqueous alkaline solution prior to development. Polymer A is capable of being crosslinked. The antireflective coating composition is coated on a reflective substrate. The edge bead which may form during the spinning process can then be removed using an edgebead removing solvent, since the polymer is still soluble in solvents used as edgebead removers. The coating is then baked to remove the solvent of the coating solution and also to crosslink the antireflective coating, in particular polymer A, in order to prevent or minimize the extent of intermixing between the layer and the photoresist and make the coating insoluble in the aqueous alkaline developer. Although not being bound by theory, it is believed that during the curing step a reaction takes place between the crosslinking agent, especially compounds containing vinyl ether terminal groups, and the crosslinkable groups like hydroxyl and/or a carboxyl group of polymer A in the antireflective coating, to form acid labile groups within the coating. After baking and curing the upper antireflective coating layer comprising polymer A is essentially insoluble in both an alkaline developing solution and the solvent of the photoresist. The lower layer comprising polymer B may or may not be crosslinked during the curing step; if polymer B comprises crosslinkable groups then it is capable of being crosslinked, but prior to development polymer B is soluble in the aqueous alkali developer. After exposure and prior to development in an aqueous alkaline solution, the acid labile groups, in polymer A and/or polymer B cleave in the presence of an acid to form groups which make polymer A and/or polymer B soluble in the aqueous alkaline solution.

A positive photoresist is coated on top of the cured antireflective coating and baked to remove the photoresist solvent. Prior to exposure to actinic radiation both the photoresist and the upper layer of the phase separated antireflective coating are insoluble in the aqueous alkaline developing solution of the photoresist. The multilevel system is then imagewise exposed to radiation in one single step, where an acid is then generated in both the top photoresist and the bottom antireflective coating. The photoacid generator present in the antireflective coating is photolysed by the radiation. In a subsequent baking step, in the exposed regions the polymer of the antireflective coating with the crosslinked sites (acid labile groups) and/or additional acid labile groups present on the polymer, are decomposed in the presence of the photogenerated acid, thus making the polymer and hence the antireflective coating soluble in the aqueous alkaline developer. A subsequent developing step then dissolves the exposed regions of both the positive photoresist and the antireflective coating, thus producing a positive image, and leaving the substrate clear for further processing.

The novel antireflective coating that is useful for the novel process of this invention comprises a crosslinking agent, a polymer A, a polymer B, a photoacid generator and optionally a thermal acid generator and/or quencher. The polymer A comprises at least one crosslinkable moiety like a hydroxyl and/or a carboxyl group, at least one absorbing chromophore and an optional fluorinated group, where these moieties are present in one unit or separately in different monomeric units or as mixtures in different monomeric units. For example, the chromophore and the hydroxy moieties may be in one unit and the fluorinated group in another unit or the fluorinated group and the crosslinkable group may be in one unit and the chromophore in another unit, etc. The difference in the hydrophobicity of polymer A and polymer B allows the two polymers to phase separate and form essentially two separate layers due to their differing free surface energies, with polymer A being more hydrophobic than polymer B. The fluorinated group in the polymer A increases the water contact angle of the polymer thus increasing the hydrophobicity of polymer A relative to polymer B. The absorbing chromophore is bound within the polymer chain, as opposed to being a free dye in the composition, in order to avoid decomposition or sublimation of the free dye during the process of baking the coating. The hydroxy and/or the carboxy unit provide the crosslinkable site.

The polymer A and optionally polymer B of the antireflective coating comprise a chromophore group which is capable of absorbing radiation used to expose the photoresist. Examples of an absorbing chromophore are hydrocarbon aromatic moieties and heterocyclic aromatic moieties with from one to four separate or fused rings, where there are 3 to 10 atoms in each ring. Examples of monomers with absorbing chromophores that can be polymerized are vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents may be any hydrocarbyl group and may further contain heteroatoms, such as, oxygen, nitrogen, sulfur or combinations thereof. Examples of such groups are ($C_1$-$C_{12}$) alkylene, esters, ethers, etc. Other chromophores are described in U.S. Pat. Nos. 6,114,085, 5,652,297, 5,981,145, 6,187,506, 5,939,236, and 5,935,760, which may also be used, and are incorporated herein by reference. The monomers may be vinyl compounds, such as, vinyl ester compounds, vinyl ether compounds, vinyl aromatics, vinyl alkylenearomatic compounds, etc. The preferred chromophoric monomers are vinyl compounds of substituted and unsubstituted phenyl, substituted and unsubstituted anthracyl, and substituted and unsubstituted naphthyl; and more preferred monomers are styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, phenol methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylaminophenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate and equivalent structures. It is within the scope of this invention that any chromophore that absorbs at the appropriate exposure wavelength may be used alone or in combination with other chromophores. The substituents may be hydroxyl, alkyl, ester, ether, alkoxycarbonyl, fluoroalcohol, vinyloxyalkylene, etc.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or isopropyl, n-iso, or tert-butyl, linear or branched pentyl, hexyl, heptyl, octyl, decyl, dodecyl, tetradecyl and hexadecyl. Unless otherwise stated, alkyl refers to 1-10 carbon atom moieties. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo [4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

When the polymer(s) of the novel invention comprises at least one unit with a crosslinking site, the crosslinking site may be exemplified by a hydroxyl and/or a carboxyl group and which also provides alkaline solubility. One function of the polymer is to provide a good coating quality and another is to enable the antireflective coating to change solubility during the imaging process. The hydroxyl or carboxyl groups in the polymer provide one of the components necessary for the solubility change. Examples of monomers which provide such a unit upon polymerization are without limitations, substituted or unsubstituted vinyl monomers containing a hydroxyl and or carboxyl group, such as acrylic acid, methacrylic acid, vinyl alcohol, hydroxystyrenes, vinyl monomers containing 1,1',2,2',3,3'-hexafluoro-2-propanol, although any monomer that makes the polymer alkali soluble and preferably water insoluble, may be used. The polymer may contain a mixture of monomer units containing hydroxyl and/or carboxyl groups. Vinyl monomers containing the 1,1,1,3,3,3-hexafluoro-2-propanol group are exemplified with the compounds represented by structures (1) to (6) and their substituted equivalents.

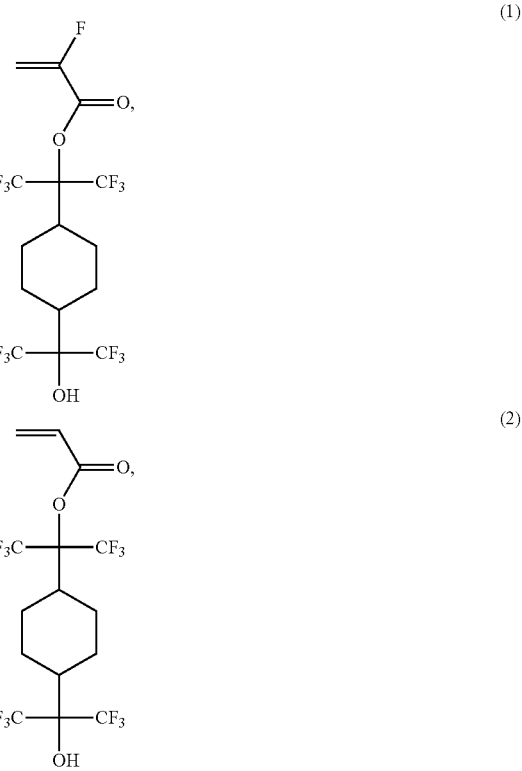

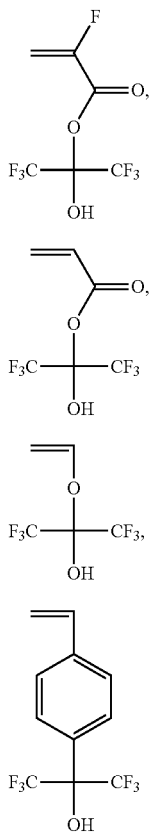

(3)

(4)

(5)

(6)

When the polymer of the novel invention comprises at least one unit with a fluorinated moiety, the fluorinated moiety may be in the backbone of the polymer or as a pendant group. The pendant fluorinated moiety may be attached to the unit through an ether group, ester group, alkyl group, aryl, aralkyl, etc. The fluorinated moiety may be partially fluorinated alkyl group or fully fluorinated alkyl group or partially fluorinated alkylalcohol group or fully fluorinated alkylalcohol group. The fluorinated moiety may have attached to it a hydroxyl, halogen or carboxylic acid group. Examples of a unit with fluorinated groups are structures 1-6, hexafluoro (branched or linear)propanol, fluorinated alkyl, fluorinated aryl, fluorinated aralkyl, and mixtures thereof. Specifically polymer A contains such fluorinated groups as those derived from monomers such as pentafluoropropylmethacrylate, 1-cyclohexyl-4,4,4-trifluoro-3-hydroxy-3-(trifluoromethyl)butyl methacrylate (MA-ACH-HFA), and 1-methyl-[4,4,4-trifluororo-3-hydroxy-3(trifluoromethyl)butyl]methacrylate. In one case the polymer A comprises a unit with a phenolic group and a unit with the fluoroalcohol group, 3,5-bis(hexafluoro-2-hydroxy-2-propyl)cyclohexyl methacrylate.

Other than the unit(s) containing the crosslinking group, the fluorinated group and the absorbing chromophore, the polymer may contain other monomeric units; such units may provide other desirable properties. Examples of the additional monomer are —$CR'_1R'_2$—$CR'_3R'_4$—, where $R'_1$ to $R'_4$ are independently H, ($C_1$-$C_{10}$) alkyl, ($C_1$-$C_{10}$) alkoxy, nitro, halide, cyano, alkylaryl, alkenyl, dicyanovinyl, $SO_2CF_3$, COOD, $SO_3D$, COD, OD, $ND_2$, SD, $SO_2D$, NHCOD, $SO_2ND_2$, where D is H, or ($C_1$-$C_{10}$) alkyl, hydroxy ($C_1$-$C_{10}$) alkyl, ($C_1$-$C_{10}$) alkylOCOCH$_2$COCH$_3$, or $R'_2$ and $R'_4$ combine to form a cyclic group such as anhydride, pyridine, or pyrollidone, or $R'_1$ to $R'_3$ are independently H, ($C_1$-$C_{10}$) alkyl, ($C_1$-$C_{10}$) alkoxy and $R'_4$ is a hydrophilic group. Examples of the hydrophilic group, are given here but are not limited to these: O(CH$_2$)$_2$OH, O(CH$_2$)$_2$O(CH$_2$)OH, (CH$_2$)$_n$ OH (where n=0-4), COO(C$_1$-C$_4$) alkyl, COOE and SO$_3$E (where E is H, ammonium, alkyl ammonium. Other monomers may be methyl methacrylate, butyl methacrylate, hydroxyethyl methacrylate and hydroxypropyl methacrylate. Monomeric units containing acid labile groups may also be used, such as hydroxystyrene, vinyl alcohol, (meth)acrylic acid capped with acid labile groups. Examples of acid labile groups, without limitation, are secondary and tertiary alkyls (up to 20 carbon atoms) with at least one β hydrogen, acetals and ketals, trimethylsilyl, and β-trimethylsilyl substituted alkyls. Representative examples of acid labile groups are tert-butyl, tert-pentyl, isobornyl, 1-alkylcyclohexyl, 1-alkylcyclopentyl, cyclohexyl, 2-alkyl-2-adamantyl, 2-alkyl-2-norbornyl. Other examples of acid labile groups are tetrahydrofuranyl, tetrahydropyranyl, substituted or unsubstituted methoxycarbonyl, (β-trialkylsilylalkyl groups (e.g. CH$_2$—CH$_2$Si(CH$_3$)$_3$, CH(—CH$_2$Si(CH$_3$)$_3$)$_2$, CH$_2$—CH(Si(CH$_3$)$_3$)$_2$ and the like.

One function of the polymer is to enable the antireflective coating to change solubility from exposure to development using labile groups. The polymer(s) can comprise acid labile groups or thermally labile groups which can provide the solubility change prior to development. The unprotected labile groups are hydrophilic groups such as carboxylic acid, hydroxy, fluoroalkylalochols, sulfonamides, etc. The labile groups may or may not be present in polymer A and polymer B. The polymer comprising the hydrophilic moiety prior to protection is soluble in an aqueous alkaline solution, but when protected with an acid labile group becomes insoluble. Examples of monomers that are hydrophilic and impart alkali solubility prior to protection are groups such as acrylic acid, methacrylic acid, vinyl alcohol, hydroxystyrenes, vinyl monomers containing 1,1',2,2',3,3'-hexafluoro-2-propanol and sulfonamides (e.g., 2-trifluoromethanesulfonylaminoethyl methacrylate and 2-sulfonylamino-2,2-difluoroethylmethacrylate), although any group that makes the polymer alkali soluble may be used. The hydrophilic functionalities can be protected with acid labile groups such as alkyl, cycloalkyl, substituted cycloalkyl, oxocyclohexyl, cyclic lactone, benzyl, silyl, alkyl silyl, substituted benzyl, alkoxy alkyl such as ethoxy ethyl or methoxy ethoxy ethyl, acetoxyalkoxy alkyl such as acetoxy ethoxy ethyl, tetrahydrofuranyl, menthyl, tetrahydropyranyl and mevalonic lactone. Examples of acid labile groups include, but are not limited to, t-butoxycarbonyl, tricyclo(5.3.2.0)decanyl, 2-methyl-2-adamantyl, ethylcyclopentyl, isobornyl, norbornyl, adamantyloxyethoxy ethyl, menthyl, tertiary butyl, tetrahydropyrany, 3-oxocyclohexyl, 3-hydroxy-1-adamantyl, beta-(gamma-butyrolactonyl), and mevalonic lactone. Some of the monomers are vinyl compounds with the above mentioned labile groups. The acid labile group that can be cleaved with an acid may be attached to the polymer, which in the presence of an acid gives an alkali soluble polymer. The protected monomers may be polymerized to give homopolymers or with other unprotected monomers as required. Alternatively, an alkali soluble homopolymer or copolymer may be reacted with a compound, or compounds, which provide the acid labile group.

In one embodiment of polymer A, the polymer comprises a chromophore; a crosslinking site, and a fluorinated moiety. The chromophore may be any of those described above and may be further exemplified by monomers such as 4-hydroxystyrene and 4-hydroxyphenyl (meth)acrylate.for 193 nm exposure applications and 9-anthracenylmethyl methacrylate or vinyl anthracene, for 248 nm applications. The crosslinking site may be any of those described above or other known functionalities, and may be further exemplified by phenolic hydroxyl groups, fluoroalcohol groups and carboxylic groups. The fluorinated moiety may be any of those described above and may be further exemplified by monomers such as pentafluoropropyl(meth)acrylate, 1-cyclohexyl-4,4,4-trifluoro-3-hydroxy-3-(trifluoromethyl)butyl methacrylate (MA-ACH-HFA), and 1-methyl-[4,4,4-trifluororo-3-hydroxy-3(trifluoromethyl)butyl]methacrylate. In one case the polymer A comprises a unit with a phenolic group and a unit with a fluoroalcohol group, 3,5-bis(hexafluoro-2-hydroxy-2-propyl)cyclohexyl methacrylate.

In another embodiment of polymer A, the polymer comprises a chromophore, a fluorinated moiety, a crosslinking site and an acid labile group. The chromophore may be any of those described above and may be further exemplified by 4-hydroxystyrene and 4-hydroxyphenyl (meth)acrylate. The crosslinking site may be any of those described above and may be further exemplified by hydroxyl groups and carboxylic groups. The fluorinated moiety may be any of those described above and may be further exemplified by pentafluoropropylmethacrylate. The acid labile group may be any of those described previously and may be exemplified by monomers such as 2-ethyladamantyl methacrylate, ethylcyclopentyl, and 2-methyl-2-adamantyl. In one case the polymer A comprises a unit with a phenolic group, acid cleavable adamantyl group and a unit with a fluoroaliphatic group. Other examples of polymer A include 2-methyladamantyl methacrylate or 2-ethyladamantyl methacrylate or ethylcyclopentyl acrylate for the cleaving group with 1-methyl-[4,4,4-trifluororo-3-hydroxy-3(trifluoromethyl)butyl]methacrylate and a monomer with a phenolic group.

An example of polymer A is,

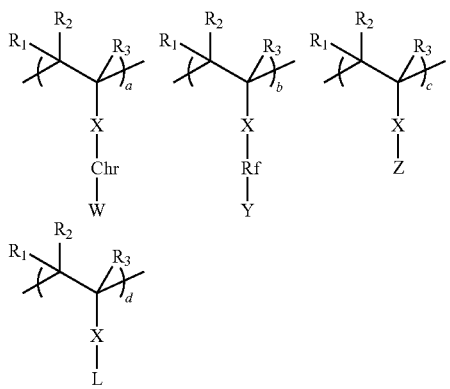

where $R_1$ to $R_3$ are independently H or $C_1$-$C_4$ alkyl, X is a single valence bond or a linking group, Chr comprises a chromophore, W is H, or crosslinking functionality, $R_f$ is partially or fully fluorinated alkyl group, Y is selected from H, OH, COOR and COOH, R is alkyl, Z is crosslinking functionality, L is a labile group, a>1, b>1 and c≥0, d≥0, a, b, c and d are positive integers when present. In one embodiment of polymer A, a>1, b>1 and c≥0, d>0, a, b, c and d are positive integers when present. The linking group X, as used herein, may be alkyl, oxygen, carbonyl, carboxyl, and mixtures thereof. The labile group, L, as used herein is a group which can be cleaved from the polymer, such as under thermal conditions or under acidic or basic conditions. Examples of L are 2-ethyladamantyl, 2-methyladamantyl, ethylcyclopentyl, and mevalonic lactone. Z as a crosslinking functionality may be hydroxyl, carboxylic acid, carboxylic ester, phenolic or epoxy. Z as phenol is preferred. W may be hydrogen or crosslinking functionality. Chr is a chromophore as described previously.

Polymer A is soluble in the coating solvent and during the coating process separates to form an upper layer in the antireflective coating. Polymer B is soluble in the coating solvent and during the coating process separates to form a lower layer in the antireflective coating. Polymer B is more hydrophilic than Polymer A. Polymer A is absorbing and comprises a chromphore. Polymer B may or may not be absorbing and can optionally comprise a chromophore. Polymer B may comprise a fluorinated group but must be more hydrophilic than polymer A. Polymer B is soluble in an aqueous alkaline solution prior to development, especially the aqueous alkaline developer used for the development of the photoresist. Additionally, polymer B after coating may or may not be soluble in an aqueous alkaline solution but is soluble prior to development. The solubility change in polymer B may happen by cleaving a thermally or acid labile group using the groups described herein. In one embodiment of polymer B in the composition, the polymer is soluble in an aqueous alkaline solution. Polymer B comprises a hydrophilic functionality such as aromatic or alkyl hydroxyl, fluorinated alkyl alcohol, carboxylic acid, amide, sulfonamide, sulfonic acid, and an optional chromophore. Preferred are aromatic hydroxyl and hexafluoroalcohol groups. Further examples of monomers useful for Polymer B are homopolymers and copolymers of hydroxystyrene,-[(4-hydroxyphenyl) methacrylate] alkyl(meth)acrylates, alkyl or fluoroalkyl sulfonamide-group containing monomers, amide group containing monomers such methacrylamide, [(2-hydroxyethyl)methacrylate]. Polymer B can be poly(4-hydroxyphenyl)methacrylate, poly (hydroxystyrene) or a copolymer of poly(hydroxystyrene)-co-methyl methacrylate. Polymer B may comprise acid labile groups which are present in the polymer B of the composition. Polymer B may comprise crosslinking functionality which reacts with a crosslinker to form acid labile groups, but such acid labile groups are cleaved in the presence of the photogenerated acid.

The hydrophobicity or hydrophilicity of polymer A and polymer B can be measured using water contact angles. The contact angle can be measured using standard techniques such as the standard video contact angle technique. Polymer A has a higher contact angle than polymer B, where the difference (contact angle of polymer A-contact angle of polymer B) in the water contact angles is in the range 5-25 degrees, or 5-20 degrees, or 5-15 degrees or 5-10 degrees or 10-25 degrees or 10-20 degrees or 15-25 degrees or 15-20 degrees.

The polymers of this invention may be synthesized using any known method of polymerization, such as ring-opening metathesis, free-radical polymerization, condensation polymerization, using metal organic catalysts, or anionic or cationic copolymerization techniques. The polymer may be synthesized using solution, emulsion, bulk, suspension polymerization, or the like. The polymers of this invention are polymerized to give a polymer with a weight average molecular weight from about 1,000 to about 1,000,000, preferably from about 2,000 to about 80,000, more preferably from about 6,000 to about 50,000. The polydispersity (Mw/Mn) of the free-radical polymers, where Mw is the weight average molecular weight and Mn is the number average molecular weight, can range from 1.0 to 10.0, where the molecular weights of the polymer may be determined by gel permeation chromatography.

The novel antireflective coating composition is coated and then cured on the substrate by the application of heat. Heating induces a crosslinking reaction between the carboxyl group or hydroxyl group on the polymer and the crosslinking agent, and the acid or thermally labile crosslinkages are formed. A particular labile acetal crosslinkage can easily be facilitated when the crosslinking agent is a vinyl ether terminated compound and the polymer contains a carboxyl group or hydroxyl group. The resulting structure can be highly solvent-resistant and impervious to the interdiffusion of photoresist components. Such curing processes are the same as those of the normal thermosetting antireflective coatings.

The vinyl ether terminated crosslinking agents that are useful in the instant invention can be represented by the general structure (7):

$$R\text{--}(OCH=CH_2)_n \quad (7)$$

wherein R is an organic group. R may be selected from ($C_1$-$C_{30}$) linear, branched or cyclic alkyl, substituted or unsubstituted ($C_6$-$C_{40}$) aryl, substituted or unsubstituted ($C_7$-$C_{40}$) alicyclic hydrocarbon; and n≥2. It is believed that the terminal vinyl ether group reacts with the hydroxyl or carboxyl group of the polymer to give an acid labile acetal linkage. Examples of such vinyl ether terminated crosslinking agents include bis(4-vinyloxy butyl) adipate; bis(4-vinyloxy butyl) succinate; bis(4-vinyloxy butyl) isophathalate; bis(4-vinyloxymethyl cyclohexylmethyl) glutarate; tris(4-vinyloxy butyl) trimellitate; bis(4-vinyloxy methyl cyclohexyl methyl) terephthalate; bis(4-vinyloxy methyl cyclohexyl methyl) isophthalate; bis(4-vinyloxy butyl) (4-methyl-1,3-phenylene) biscarbamate; 1,2,4-tris(4-vinyloxybutyl)cyclohexanetricarboxylate; bis(4-vinyloxy butyl) (methylene di-4,1-phenylene) biscarbamate; and triethyleneglycol divinylether, 1,4-cyclohexanedimethanol divinyl ether, various Vectomer® vinyl ether monomers supplied by Aldrich Company, and polymers bearing pendant vinyloxy groups. Other vinyl ether terminated crosslinking agents are described in T. Yamaoka, et al., Trends in Photochem. Photobio., 7:45 (2001); S. Moon, et al., Chem. Mater., 6:1854 (1994); or H. Schacht, et al., ACS Symp. Ser. 706:78 (1998) which may also be used, and are incorporated herein by reference. Another crosslinking agent or quencher that can provide labile groups when reacted with the polymer are disclosed in U.S. application Houlihan et al with Ser. No. 12/269,072 filed Nov. 12, 2008 and incorporated herein by reference.

The crosslinking agent may be added to the antireflective coating in a proportion which provides 0.20-2.00 mol equivalents of vinyl ether crosslinking function per reactive group on the polymer, especially preferred is 0.50-1.50 reactive equivalents per reactive group.

The antireflective coating composition of the present invention comprises a photoacid generator, the photoacid generator in the antireflective coating and the photoacid generator in the photoresist are sensitive to the same wavelength of light, and thus the same radiant wavelength of light can cause an acid to be formed in both layers. The acid in the exposed areas of the antireflective coating, present through photogeneration from the photoacid generator in the antireflective film, reacts with the acid labile crosslinkages to decrosslink the polymer, thus making the exposed areas of the antireflective coating soluble in the aqueous alkaline developer. The photoacid generator of the antireflective coating chosen depends on the photoresist to be used. The photoacid generator (PAG) of the novel composition is selected from those which absorb at the desired exposure wavelength, preferably 248 nm, 193 nm and 157 nm for deep ultraviolet photoresists, and naphthoquinone diazides or sulfonium salts for 365 nm, 436 nm and broadband photoresists. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

For exposure at 365 nm the photoacid generator can be sulfonium salts or diazonaphthoquinones, especially 2,1,4-diazonaphthoquinones that are capable of producing acids that can react with the acid labile groups of the polymer. Oxime sulfonates, substituted or unsubstituted naphthalimidyl triflates or sulfonates are also known as photoacid generators. Any photoacid generator that absorbs light at the same wavelength as the top photoresist may be used. Photoacid generators known in the art may be used, such as those disclosed in the U.S. Pat. Nos. 5,731,386, 5,880,169, 5,939, 236, 5,354,643, 5,716,756, DE 3,930,086, DE 3,930,087, German Patent Application P 4,112,967.9, F. M. Houlihan et al., J. Photopolym. Sci. Techn., 3:259 (1990); T. Yamaoka et al., J. Photopolym. Sci. Techn., 3:275 (1990)), L. Schlegel et al., J. Photopolym. Sci. Techn., 3:281 (1990) or M. Shirai et al., J. Photopolym. Sci. Techn., 3:301 (1990), and the US patent and patent applications are incorporated herein by reference.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative, such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

The composition of the present invention may further comprise a thermal acid generator. Crosslinking can take place between a polymer containing a hydroxyl and/or carboxyl group and a crosslinking agent in the presence of heat; however, typically reaction times may be long. Thermal acid generators are used to accelerate the crosslinking reaction and are desirable for instances where short curing times are preferred. Thermal acid generators liberate the acid upon heating. Any known acids or thermal acid generators may be used, exemplified without limitations, by 2,4,4,6-tetrabromocyclohexadienone, benzoin tosylate, squaric acid, 2-nitrobenzyl tosylate, chloroacetic acid, toluenesulfonic acid, methanesulfonic acid, nonaflate acid, triflic acid, other alkyl esters of organic sulfonic acids, salts of these mentioned acids. Additionally, acids with moderate acidity, i.e. with a pKa ($-\log_{10}$ of the acid dissociation constant) greater than 1.0 can be used, especially in combination with a vinyl terminated crosslinking agent. Acids with a pKa of less than 5.0 and greater than 1.0 can also be used. The resulting acetal linkages are easily cleavable in the presence of photogenerated acids. Examples, without limitations, of acids or acids derived from thermal acid generators with moderate acidity are maleic acid (pKa of 1.83), chloroacetic acid (pKa of 1.4), dichloroacetic acid (pKa of 1.48), oxalic acid (pKa of 1.3), cinnamic acid (pKa of 4.45), tartaric acid (pKa of 4.3), gylcolic acid (pKa of 3.8), fumaric acid (pKa of 4.45), malonic acid (pKa of 2.8), cyanoacetic acid (pKa of 2.7), etc. Acids which are blocked by bases to form a thermal acid generator are preferred. Acids, such as those described above, may be blocked with bases such as amines. Typical bases are triethyl amine, tripropyl amine, trimethyl amine, tributyl amine, tripentyl amine, tridodecyl amine etc. Additionally, diaryl or trialkyl sulfonium salts with anions of weak acids, such as carboxylic acid or aryl carboxylic acid may be used. Acids which are blocked by bases may be formed by combining the acid with a base, where the acid:base ratio ranges from about 1:1 to about 1:3. Further examples of acids with the desired pKa and their salts can be found by one of ordinary skill in the art by reviewing the available literature, such as in CRC Handbook of Chemistry and Physics, published by CRC Press Inc. and incorporated herein by reference. In some embodiments it may also be desirable that the thermal acid be such that once the acid is generated it does not remain permanently in the coating and therefore does not facilitate the reverse reaction, but is removed from the film. It is believed that, once crosslinking takes place the acid is decomposed or volatilized by heat and the decomposition products are baked out of the film, or the acid may sublime from the coating. Thus none or very little of the free acid remains in the film after curing, and the reverse reaction causing the decomposition of the acetal linkage does not take place. Thermal acid generators which can generate an acid and then be removed prior to coating of the photoresist are preferred in some cases. Weak acids that remain in the film may also be functional, as they may not greatly hinder the decomposition of the acetal linkage. The acid derived from the thermal acid generator is preferably removed from the antireflective coating at temperatures ranging from about 130° C. to about 220° C., more preferably 150° C. to about 200° C. The thermal acid generators may be present in the antireflective composition at levels ranging from 0.1 to 25 weight % of solids, especially 0.1 to about 5 weight %.

Typical antireflective coating compositions of the present invention may comprise up to about 15 percent by weight of the solids, preferably less than 8 percent, based on the total weight of the coating composition. The solids may comprise from 0.01 to 25 weight percent of the photoacid generator, 50 to 99 weight percent of polymers, 1 to 50 weight percent of the crosslinking agent and optionally 0.01 to 25 weight percent of the thermal acid generator or quencher, based on the total solids content of the antireflective coating composition. Preferably the photoacid generator level ranges from about 0.01 to about 20 weight %. The weight ratio of polymer A to Polymer B is adjusted according to lithographic requirements of the substrate. The proportion of polymer B in the composition is tuned to match the topography of the substrate. Deeper topographical features would require larger amounts of polymer B relative to polymer A. Polymer A:Polymer B can be in the ratio of 4:1 to 1:4 or 3:1 to 1:3, or 2:1 to 1:2 by weight. Preferably the crosslinking agent ranges from about 5 to about 40 weight percent, more preferably 10 to 35 weight percent. The solid components are dissolved in the solvent, or mixtures of solvents, and filtered to remove impurities. The components of the antireflective coating may also be treated by techniques such as passing through an ion exchange column, filtration, and extraction process, to improve the quality of the product.

Other components may be added to the antireflective composition of the present application in order to enhance the performance of the coating, e.g. lower alcohols, surface leveling agents, base quenchers, adhesion promoters, antifoaming agents, etc. These additives may be present at up to 30 weight percent level. Other polymers, such as, novolaks, polyhydroxystyrene, polymethylmethacrylate and polyarylates, may be added to the composition, providing the performance is not negatively impacted. Preferably the amount of this polymer is kept below 35 weight % of the total solids of the composition, more preferably 20 weight %, and even more preferably below 15 weight %. Bases may also be added to the composition to enhance stability. Both photobases and nonphotobases are known additives. Examples of bases are amines, ammonium hydroxide, and photosensitive bases. Particularly preferred bases are tetrabutylammonium hydroxide, triethanolamine, diethanol amine, trioctylamine, n-octylamine, trimethylsulfonium hydroxide, triphenylsulfonium hydroxide, bis(t-butylphenyl)iodonium cyclamate and tris (tert-butylphenyl)sulfonium cyclamate.

The absorption parameter (k) of the novel composition ranges from about 0.1 to about 1.0, preferably from about 0.15 to about 0.7 as measured using ellipsometry. The refractive index (n) of the antireflective coating is also optimized. The n and k values can be calculated using an ellipsometer, such as the J. A. Woollam WVASE VU-302 TM Ellipsometer. The exact values of the optimum ranges for k and n are dependent on the exposure wavelength used and the type of application. Typically for 193 nm the preferred range for k is 0.1 to 0.75, for 248 nm the preferred range for k is 0.15 to 0.8, and for 365 nm the preferred range is from 0.1 to 0.8. The thickness of the antireflective coating is less than the thickness of the top photoresist. Preferably the film thickness of the antireflective coating is less than the value of (wavelength of exposure/refractive index), and more preferably it is less than the value of (wavelength of exposure/2 times refractive index), where the refractive index is that of the antireflective coating and can be measured with an ellipsometer. The optimum film thickness of the antireflective coating is determined by the exposure wavelength, refractive indices of the antireflective coating and of the photoresist, absorption characteristics of the top and bottom coatings, and optical characteristics of the substrate. Since the bottom antireflective coating must be removed by exposure and development steps, the optimum film thickness is determined by avoiding the optical nodes where no light absorption is present in the antireflective coating.

The antireflective coating composition is coated on the substrate using techniques well known to those skilled in the art, such as dipping, spin coating or spraying. Various substrates known in the art may be used, such as those that are planar, have topography or have holes. Examples of semiconductor substrates are crystalline and polycrystalline silicon, silicon dioxide, silicon (oxy)nitride, aluminum, aluminum/silicon alloys, and tungsten. In certain cases there can be a buildup of photoresist film at the edges of the substrate, referred to as edge bead. This edge bead can be removed using a solvent or mixture of solvents using techniques well known to those of ordinary skill in the art. The composition of the present invention is particularly compatible with edge bead removers. Typical solvents used for edge bead removers are ethyl lactate, butyl acetate, propyleneglycol monomethyletheracetate, propyleneglycol monomethylether, or mixtures thereof. The coating is then cured. The preferred range of temperature is from about 120° C. to about 240° C. for about 30-120 seconds on a hot plate or equivalent heating unit, more preferably from about 150° C. to about 200° C. for 45-90 seconds. The film thickness of the antireflective coating can range from about 20 nm to about 300 nm. The thickness of the phase separated bottom layer can be in the range of about 10 nm to about 200 nm. The thickness of the phase separated upper layer can be in the range of about 10 nm to about 100 nm. The optimum film thickness is determined, as is well known in the art, to be where good lithographic properties are obtained, especially where no standing waves are observed in the photoresist. FIG. 1 shows the phase separation of the antireflective coating, where the novel developable bottom antireflective coating (DBARC) of the present invention is coated over a substrate with topography. The coating phase separates, where the polymer B predominantly covers the topography and polymer A predominantly forms the upper layer over the topographical features. The cured upper antireflective layer of the DBARC is insoluble at this stage in the alkaline developing solution. The photoresist can then be coated on top of the antireflective coating.

Positive photoresists, which are developed with aqueous alkaline solutions, are useful for the present invention, provided the photoactive compounds in the photoresist and the antireflective coating absorb at the same exposure wavelength used for the imaging process for the photoresist. Positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 300 nm to 440 nm.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure below 200 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference.

A film of photoresist is then coated on top of the cured antireflective coating and baked to substantially remove the photoresist solvent. The photoresist and the antireflective coating layers are then imagewise exposed to actinic radiation. In a subsequent heating step the acid generated during exposure step reacts to de-crosslink the polymer of the antireflective coating composition and thus rendering the exposed region of the antireflective coating alkali soluble in the developing solution. The temperature for the postexposure bake step can range from 40° C. to 200° C. for 30-200 seconds on a hot plate or equivalent heating system, preferably from 80° C. to 160° C. for 40-90 seconds. In some instances, it is possible to avoid the postexposure bake, since for certain chemistries, such as some acetal acid labile linkages, deprotection may proceed at room temperature. The polymers in the exposed regions of the antireflective coating are now soluble in an aqueous alkaline solution. The bilevel system is then developed in an aqueous alkaline developer to remove the photoresist and the antireflective coating. The photoresist and the antireflective coating can be developed in a single step using the aqueous alkaline developer. The developer is preferably an aqueous alkaline solution comprising, for example, tetramethyl ammonium hydroxide. The developer may further comprise additives, such as surfactants, polymers, isopropanol, ethanol, etc. The process of coating and imaging photoresist coatings and antireflective coatings is well known to those skilled in the art and is optimized for the specific type of photoresist and antireflective coating combination used. The imaged bilevel system can then be processed further as required by the manufacturing process of integrated circuits, for example metal deposition and etching.

Each of the US patents and patent applications referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise stated the ranges and numerical values are based on weights.

EXAMPLES

The absorption parameter (k) and the refractive index (n) were measured using variable angle spectrophotometric ellipsometry. The bottom antireflective coating (B.A.R.C.) solutions were spin coated on primed silicon wafers and baked to get a given film thickness. The coated wafers were then measured using an ellipsometer manufactured by J.A. Woollam or Sopra Corporation. The obtained data were fitted to get the k and n values of the B.A.R.C. films. Water contact angles were measured using VCA 2500XE video contact angle equipment.

Example 1

Synthesis of (PQMA/AMMA/MA-BTHB-OH) terpolymer

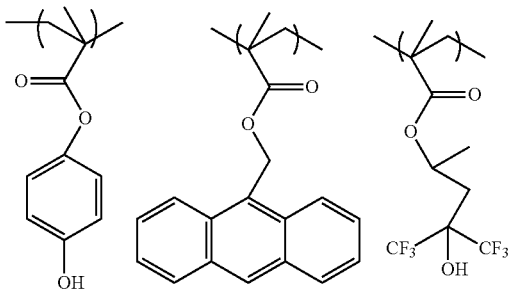

In a 250 mL round bottom flask equipped with a stirrer, thermocouple and reflux condenser under nitrogen, 9-anthracenylmethyl methacrylate (AMMA, 4.34 g), 4-hydroxyphenyl methacrylate (PQMA, 8.410 g), 1-hydroxy-1,1-bis(trifluoromethyl)-3-butyl methacrylate (MA-BTHB-OH, 4.87 g), 2,2'-azobis(2-methylpropionitrile) (AIBN, 0.86 g), and tetrahydrofuran (THF, 106.50 g) were added and stirred to dissolve the solids. The mixture was heated to 65° C. for 5 hours, cooled for 30 minutes to room temperature, then precipitated into hexanes (800 mL). The precipitate was collected by vacuum filtration, dissolved in tetrehyrofuran (THF) (90 mL), and precipitated in hexanes (800 mL) once, again. The precipitate was collected by vacuum filtration and dried at 45° C. to yield a white solid (14.4 g, 79%). Polymer molecular weight and NMR composition are provided in Table 1.
The polymer had n&k values at 248 nm of 1.56 & 0.33 and 1.76 & 0.46 at 193 nm.

Example 2

Synthesis of PQMA/EAdMA/PFPMA terpolymer

In a 250 mL round bottom flask equipped with a stirrer, thermocouple and reflux condenser under nitrogen, 2-ethyladamantylmethacrylate (EAdMA, 7.75 g), 4-hydroxyphenyl methacrylate (PQMA, 16.69 g), 2,2,3,3,3-pentafluoropropylmethacrylate (PFPMA, 6.81 g), 2,2'-azobis(2-methylpropionitrile) (AIBN, 6.25 g), and tetrahydrofuran (THF, 87.50 g) were added and stirred to dissolve. The mixture was heated to 65° C. for 5 hours, cooled for 30 minutes to room temperature, then precipitated into hexanes (875 mL). The precipitate was collected by vacuum filtration, dissolved in THF (85 mL), and precipitated in hexanes (875 mL) once again. Finally, the precipitate was redissolved in 80 mL of methanol and precipitated in water (875 mL). The precipitate was collected by vacuum filtration and dried at 45° C. to yield a white solid (23.14 g, 74%). Polymer molecular weight and NMR composition are provided in Table 1.
The polymer had n&k values at 193 nm of 1.81 and 0.59

Example 3

PQMA/PFPMA/MA-3,5-HFA-CHOH terpolymer

In a 250 mL round bottom flask equipped with a stirrer, thermocouple and reflux condenser under nitrogen, 3,5-bis(hexafluoro-2-hydroxy-2-propyl)cyclohexyl methacrylate (MA-3,5-HFA-CHOH, 8.28 g), 4-hydroxyphenyl methacrylate (PQMA, 11.78 g), 2,2,3,3,3-pentafluoropropylmethacrylate (PFPMA, 6.02 g), 2,2'-azobis(2-methylpropionitrile) (AIBN, 3.91 g), and tetrahydrofuran (THF, 70.00 g) were added and stirred to dissolve. The mixture was heated to 65° C. for 5 hours, cooled for 15 minutes, quenched with methanol (3 mL), further cooled to room temperature, and then precipitated into hexanes (750 mL). The precipitate was collected by vacuum filtration, dissolved in THF (85 mL), and precipitated in hexanes (750 mL) once again. Finally, the precipitate was redissolved in 70 g of methanol and precipitated in water (750 mL). The precipitate was collected by vacuum filtration and dried at 45° C. to yield a white solid (22.19 g, 85%). The n & k values of the polymer were 1.71 and 0.38 at 193 nm. Polymer molecular weight and NMR are provided in Table 1.

Example 4

Evidence of Phase Separation of Polymers

A 15 g solution was made by mixing 0.3388 g polyhydroxysyrene and 0.27 g of the polymer from example 1 in PGMEA The solution was coated onto an 8 in. silicon wafer and baked at 180° C. for 60 minutes. The coated wafer was then used for static contact angle measurement. Similarly, other polymeric solutions were made using the polymers shown in Table 1. Depending on the viscosity of Polymer B, its relative weight ratio to Polymer A changed. In all cases, appropriate weight of Polymer B was taken to provide 100 nm FT at the same rpm as Polymer A (which gave 60 nm FT). Static Contact Angle (SCA) measurements were made to verify the ability of the various polymers to separate. The contact angle of the hydrophilic polymers alone was measured and also the contact angle of the self-separating fluorinated hydrophobic polymers. The results show that there is a layer separation between these two polymers indicating that there are sufficient chemical dissimilarities between the two polymers. The contact angle of the DBARC composition is the same, within experimental error, as the contact angle of the individual hydrophobic polymer A used in the composition, thus showing that the hydrophobic polymer forms the upper layer in the DBARC film. Also, these filling hydrophilic polymers were found to be developer soluble. The results are given in Table 1. The difference in the contact angles between the hydrophobic polymer A and the hydrophilic polymer B in the DBARC compositions is given as LSCA.

with the formulations prepared in Example 5 and baked at 170° C. for 60 s to obtain a film thickness of 70 nm. Then, AZ® DX6850P™ KrF photoresist (available from AZ®

TABLE 1

Data for 248 nm and 193 nm DBARC Applications

| Polymer(s) constituting the Film | Static Contact Angle (SCA), degrees | ΔSCA, degrees | Developer Solubility in AZ ® 300MIF | Total Film Thickness (nm) | Mw (Mol. wt.) | NMR Composition |
|---|---|---|---|---|---|---|
| PHS(Polymer B) | 62.3 | (DBARC1 − PHS) = 12.5 | Excellent | 100 | 20,000 | 100 |
| HPQMA(Polymer B) | 55.7 | SCA(DBARC2 − HPQMA) = 18.9 | Excellent | 100 | | 100 |
| Polymer from Example 1 (Polymer A) | 74.8 | SCA(DBARC1 − Polymer A) = 1.3 Polymer of Ex. 1 on surface | Excellent | 60 | 19,700 | PQMA 63.7 AMMA1 9.1 MABTH BOH 17.2 |
| PHS + Polymer from Example 1 (DBARC1) | 76.1 | Polymer of Ex. 1 on surface | Excellent | 160 | — | — |
| HPQMA + Polymer from Example 1 (DBARC2) | 74.6 | | Excellent | 160 | — | — |
| PQMA-AMMA copolymer (Polymer B) | 66.0 | SCA(Example 1 − PQMA-AMMA) = 8.8 | Poor | 60 | 7,700 | — |
| PHS-MMA (Polymer B) | 59.0 | SCA(DBARC3 − PHS-MMA) = 19.5 | Excellent | 100 | 15,500 | PHS 55 MMA 45 |
| Polymer from Example 3 (Polymer A) | 78.4 | | Excellent | 60 | 20,400 | PQMA 65.6 PFPMA 22.3 MA-3,5-HFA-CHOH 12.1 |
| PHS-MMA + Polymer from Example 3 (DBARC3) | 78.5 | SCA(DBARC3 − example 3) = 0.1 Polymer of Ex. 3 on surface | Excellent | 160 | — | — |
| Polymer from Example 2 (Polymer A) | 76.7 | SCA(DBARC4 − example 2) = −0.1 | Excellent | 60 | 12,940 | PQMA 63.5 EAdMA 21.3 PFPMA 15.2 |
| PHS-MMA + Polymer from Example 2 (DBARC4) | 76.6 | SCA(DBARC4 − PHS-MMA) = 17.6 Polymer of Ex. 2 on surface | Excellent | 160 | — | — |

PHS: polyhydroxystyrene
HPQMA: Poly(4-hydroxyphenyl)methacrylate
AMMA: 9-anthracenylmethyl methacrylate
MMA: methylmethacrylate
Polymer A: hydrophilic polymer
Polymer B: hydrophobic polymer
DBARC: Developable antireflective coating
ΔSCA: Contact angle of Polymer A or DBARC − Contact angle of Polymer B
SCA: Static contact angle

Example 5

Formulation Preparation for 248 nm Exposure

Polymer from Example 11.32 g, poly(hydroxystyrene-co-methylmethacrylate) 0.22 g, 1,2,4-tris(4-vinyloxybutyl)cyclohexanetricarboxylate 0.35 g, photoacid generator bis [(triphenyl)sulfonium] perfluorobutane sulfonate 7.1 g, tetramethylammonium deoxycholate 0.093 g, 46.96 g of PGMEA, 39.13 g of PGME and 11.74 g of EL were mixed in a plastic bottle and allowed to mix 6 hours at room temperature and lithographically evaluated as shown below.

Additional formulations were made by using poly(hydroxystyrene) or a copolymer of poly(hydroxystyrene (61)-co-t-butoxystyrene(39)) instead of poly(hydroxystyrene-co-methylmethacrylate) polymer in the above described formulation.

Example 6

Lithographic Exposure to 248 nm Wavelength

An 8-in silicon wafer was primed with HMDS at 120° C. for 35 seconds. Subsequently, the primed wafer was coated with the formulations prepared in Example 5 and baked at 170° C. for 60 s to obtain a film thickness of 70 nm. Then, AZ® DX6850P™ KrF photoresist (available from AZ® Electronic USA Corp. 70, Meister Ave., Somerville, N.J.) was coated on top of the cured film and subjected to a bake of 100° C./90 s and postexposure baked at 110° C./90 s. The features were developed using AZ 300MIF™ developer solution (available from AZ® Electronic USA Corp. 70, Meister Ave., Somerville, N.J.) for 60 s. A 0.65NA FPA3000EX5 tool with ½ annular illumination was used with 6% HTPSM mask. Features of 150, 200, 300 nm dense line/space and 220 nm isolated lines were evaluated. The results are given in Table 2.

TABLE 2

| | Lithographic results | | | |
|---|---|---|---|---|
| Polymer A (nm)/Polymer B(nm) BARC | 150 nm Dense Lines | 220 nm Isolated Lines | 200 nm Dense Lines | 300 nm Dense Lines |
| Example 1 Polymer (60)/PHS (10) | Resolved | Resolved | Not resolved | Resolved |

TABLE 2-continued

Lithographic results

| Polymer A (nm)/Polymer B(nm) BARC | 150 nm Dense Lines | 220 nm Isolated Lines | 200 nm Dense Lines | 300 nm Dense Lines |
|---|---|---|---|---|
| Example 1 Polymer (60)/PHS-tBuOSt (10) | Resolved | Resolved | Not resolved | Resolved |
| Example 1 Polymer (60)/PHS-MMA (10) | Resolved | Resolved | Resolved | Not Resolved |
| Example 1 Polymer (60)/PHS (40) | Resolved | Resolved | Resolved | Not evaluated |
| Example 1 Polymer (60)/PHS-tBuOSt (40) | Not Resolved | Resolved | Resolved | Not evaluated |
| Example 1 Polymer (60)/PHS-MMA (40) | Not Resolved | Resolved | Resolved | Not evaluated |

Example 7

254 nm & 193 nm Contact Exposure

The DBARC formulation containing poly(4-vinylphenol) 0.52 g (polymer B), 0.4 g of PQMA/AMMA/MA-BTHB-OH polymer (Example 1, polymer A), 0.23 g of 1,2,4-tris(4-vinyloxybutyl)cyclohexanetricarboxylate, 0.065 g of photoacid generator bis[(triphenyl)sulfonium] perfluorobutane sulfonate and a mixture of propyleneglycolmonomethyl ether (9.53 g)/ethyl lactate (0.65 g) was coated onto an 8" silicon wafer, baked at 180° C./60 sec. and exposed to a deepUV source 254 nm filter & 193 nm filter separately with a with a flood exposure to provide a total dose of 50 mJ using a contact mask. It was found that for 193 nm & 254 nm exposure, the DBARC image was resolved with a photosensitivity of at least 10 mJ/cm$^2$.

The invention claimed is:

1. A photoimageable antireflective coating composition capable of forming a pattern by development in an aqueous alkaline solution, comprising,
   (i) a polymer A soluble in a coating solvent and comprises a chromophore, a fluorinated group, and a crosslinking moiety, where polymer A is selected from a group consisting of;
   a) polymer A further comprising a repeat unit,

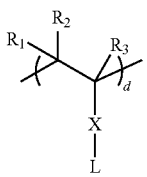

where $R_1$ to $R_3$ are independently H- or $C_1$-$C_4$ alkyl, d>0, X is a single valence bond or the linking group selected from the group consisting of alkyl, oxygen, carboxyl and mixtures thereof, L is an acid labile group, further where polymer A comprises repeat units derived from 4-hydroxyphenyl (meth)acrylate copolymerized with 3,5-bis(hexafluoro-2-hydroxy-2-propyl)cyclohexyl methacrylate;
   b) polymer A comprising repeat units derived from 9-anthracenylmethyl methacrylate,1-methyl-[4,4,4-trifluoro-3-hydroxy-3(trifluoromethyl)butyl] methacrylate and 4-hydroxyphenyl (meth)acrylate; and,
   c) polymer A comprising repeat units derived from 3,5-bis(hexafluoro-2-hydroxy-2-propyl)cyclohexyl methacrylate and repeat units derived from 4-hydroxyphenyl (meth)acrylate and pentafluoropropyl(meth)acrylate;
   (ii) at least one photoacid generator;
   (iii) a crosslinking agent;
   (iv) optionally, a thermal acid generator;
   (v) a polymer B which is soluble in an aqueous alkaline solution prior to development, where polymer B is nonmiscible with polymer A and soluble in the coating solvent, and;
   (vi) a coating solvent composition, and
   (vii) optionally, a quencher.

2. The antireflective coating composition of claim 1, where the polymer B comprises hydroxyphenyl and monomeric unit derived from an acrylate.

3. The antireflective coating composition of claim 1, where the polymer B has a water contact angle lower than polymer A.

4. The antireflective coating composition of claim 1, where the difference in the water contact angle between polymer A and polymer B is in the range 5-25 degrees.

5. A process for imaging a photoimageable antireflective coating composition, comprising;
   a) forming a coating of the bottom photoimageable antireflective coating composition of claim 1, on a substrate;
   b) baking the antireflective coating such that polymer A separates to form a layer above polymer B,
   c) providing a coating of a top photoresist layer over the bottom coating;
   d) imagewise exposing the photoresist and bottom coating layers to actinic radiation of same wavelength;
   e) post-exposure baking the photoresist and bottom coating layers on the substrate; and,
   f) developing the photoresist and bottom coating layers with an aqueous alkaline solution, thereby forming a pattern in the photoresist layer and the antireflective coating layer.

6. The process according to claim 5, further comprising the step of removal of an edgebead after the coating and prior to the baking of the antireflective coating composition.

7. The process according to claim 5, wherein the antireflective coating becomes insoluble in organic solvents and aqueous alkaline solution after the baking step prior to coating the photoresist layer and becomes soluble in aqueous alkaline solution after exposure to actinic radiation prior to developing the photoresist and bottom antireflective coating layer.

8. The process according to claim 5, where the imagewise exposure is in the range of 50 nm to 450 nm.

9. The process according to claim 5, where the developer comprises tetramethylammonium hydroxide.

* * * * *